United States Patent [19]
Takeuchi

[11] Patent Number: 5,701,379
[45] Date of Patent: Dec. 23, 1997

[54] WAVEGUIDE TYPE SEMICONDUCTOR PHOTODETECTING DEVICE AND FABRICATION PROCESS THEREFOR

[75] Inventor: Takeshi Takeuchi, Tokyo, Japan

[73] Assignee: NEC Corporation, Tokyo, Japan

[21] Appl. No.: 757,999

[22] Filed: Nov. 27, 1996

[30] Foreign Application Priority Data

Nov. 30, 1995 [JP] Japan .................... 7-334298

[51] Int. Cl.[6] ........................................ G02B 6/10
[52] U.S. Cl. ................ 385/131; 385/132; 385/14; 385/43; 257/432
[58] Field of Search .................... 257/432; 385/41, 385/43, 49, 88, 89, 90, 91, 92, 93, 94, 129, 130, 131, 132

[56] References Cited

U.S. PATENT DOCUMENTS

| | | | |
|---|---|---|---|
| 5,121,182 | 6/1992 | Kuroda et al. | 257/432 |
| 5,134,671 | 7/1992 | Koren et al. | 385/14 |
| 5,323,476 | 6/1994 | Mueller et al. | 385/43 |
| 5,521,945 | 5/1996 | Takeuchi et al. | 385/14 |

FOREIGN PATENT DOCUMENTS 0641049  3/1995  European Pat. Off. .

OTHER PUBLICATIONS

K. Kato et al., "Design of Ultrawide-Band, High-Sensitivity p-i-n Protodetectors", *IEICE Trans. Electron.*, vol. E76-C, No. 2, Feb. 1993, pp. 214-221.

*Primary Examiner*—John Ngo
*Attorney, Agent, or Firm*—Sughrue, Mion, Zinn, Macpeak & Seas, PLLC

[57] ABSTRACT

A waveguide type semiconductor photodetecting device has a semiconductor substrate, a photodetecting element, and a waveguide optically coupled with the photodetecting element which can avoid occurrence of light loss in the tapered waveguide even when a width of a light inciding side of the tapered waveguide is widened. The waveguide has a waveguide layer gradually narrowing a width and gradually increasing a layer thickness and a refraction index from light incident side to the photodetecting element. The waveguide is integrated with the photodetecting element on the semiconductor substrate.

4 Claims, 12 Drawing Sheets

WAVEGUIDE TYPE SEMICONDUCTOR PHOTODETECTING DEVICE AND FABRICATION PROCESS THEREFOR

BACKGROUND OF THE INVENTION

1. Field of the Invention

The present invention relates to a waveguide type semiconductor photodetecting device, in which an optical waveguide and a semiconductor photodetector optically coupled with the optical waveguide are integrated on a semiconductor substrate.

2. Description of the Related Art

A semiconductor photodetecting device employing a compound semiconductor has been widely employed as an element for optical communication, since such semiconductor photodetecting device facilitates obtaining of an element having a wavelength of 1.3 μm to 1.5 μm which is a low loss region of an optical fiber. As one example of the photodetecting element for optical communication can be InGaAs p-i-n photodiode, for which demands for speeding of response characteristics and enhancement of reception sensitivity have been present.

In order to improve photoelectric conversion efficiency required for enhancement of the reception sensitivity, when a light incides perpendicularly to a light absorption layer, higher efficiency can be obtained by providing thicker InGaAs light absorption layer. However, when the InGaAs light absorption layer becomes excessively thick, degradation of response speed can be caused due to limitation of traveling period of carrier. Thus, thickness of the InGaAs light absorption layer should be limited. In order to solve such trade off, attention has been paid for a waveguide type photodetecting device, in which the waveguide and the photodetecting device are integrated, as element structure. In this photodetecting device, high speed and high sensitivity element characteristics can be obtained by inciding an incident light in a direction parallel to the light absorption layer.

On the other hand, the p-i-n photodiode with the waveguide encounters a problem in low coupling tolerance with a fiber input. Namely, the p-i-n photodiode with the waveguide having an approximately 50 GHz band has inciding end face of 5 μm of waveguide width and 0.5 μm of light absorption layer thickness, which is significantly smaller than the typical surface incident type p-i-n photodiode. Then, slight offset of the inciding end face from focal position of the incident light should cause significant fluctuation of sensitivity.

In the p-i-n photodiode with the waveguide having a band in excess of 50 GHz, it becomes necessary to narrow the waveguide width to be less than or equal to 2 μm for lowering element capacity. In such case, sensitivity should be lowered for lowering of the coupling efficiency per se even when no offset is present between the end face and the focal position.

As prior art solving the problem in lowering of coupling tolerance and coupling efficiency in the p-i-n photodiode with the waveguide, a waveguide formed into tapered shape (hereinafter referred to as "tapered waveguide") is integrated at the incident side of the element to converting the spot size of the incident light to introduce into the element. One example of the conventional integration circuit "IEICE TRANS. ELECTRON., VOL. E-76-C, No. 2, p. 214, 1993) is shown in FIGS. 1A and 1B.

FIG. 1A is a plan view and FIG. 1B is a section view of the prior art. In this prior art, on a semi-insulative InP substrate 21, an InP buffer layer 22, a p$^+$-InGaAsP contact layer 23, an n$^-$-InGaAs light absorption layer 24 are provided. With partly overlapping with a stack of the foregoing layers, a tapered waveguide consisted of an n$^+$-InP clad layer 25, an n$^+$-InGaAsP core layer 26 and an n$^+$-InP clad layer 27 is provided. Furthermore, a p-side electrode 28 is provided on the p$^+$-InGaAs contact layer 23, and n-side electrode 29 is provided on the n$^+$-InP clad layer 27. Then, a width of the tapered waveguide is set to be 1 to 2 μm matching with the p-i-n photodiode at the p-i-n photodiode side and is gradually widened to be 4 μm at the inciding end face for improving coupling efficiency of the incident light.

In the conventional tapered waveguide such as that illustrated in FIGS. 1A and 1B, when the width of the waveguide at the inciding end face side is widened beyond a certain extent, higher-order mode may newly appear as the waveguiding mode in horizontal direction. On the other hand, since the width of the waveguide is narrowed at the p-i-n photodiode side to cut off such higher-order mode. Thus, all of the higher-order mode light excited at the inciding end face is reflected at the midway in propagation through the tapered waveguide to be a loss (see FIG. 9). Accordingly, the width of the waveguide at the inciding end face can be widened only within a range where the problem set forth above will not be caused. Therefore, it is not always possible to obtain sufficient coupling tolerance even in the solution as illustrated in FIGS. 1A and 1B.

On the other hand, in the shown prior art, the core layer of the tapered waveguide and the core layer (light absorption layer) of the p-i-n photodiode are respectively formed by at least twice of crystal growth, and an etching step for the crystal layer is present between the crystal growth steps, it is difficult to realize high coupling efficiency between the tapered waveguide and the p-i-n photodiode at high yield.

SUMMARY OF THE INVENTION

Therefore, it is an object of the present invention to avoid occurrence of light loss in the tapered waveguide even when a width of a light inciding side of the tapered waveguide is widened.

Another object of the invention is to enhance a coupling efficiency between an optical waveguide and a photodetecting element.

According to one aspect of the invention, a waveguide type semiconductor photodetecting device comprises:

a semiconductor substrate;

a photodetecting element;

a passive waveguide optically coupled with the photodetecting element and having a waveguide layer gradually narrowing a width and gradually increasing a layer thickness and a refraction index from light incident side to the photodetecting element, which passive waveguide is integrated with the photodetecting element on the semiconductor substrate.

In the preferred construction, the waveguide layer of the passive waveguide and/or a light absorption layer of the photodetecting element have a multiple quantum well structure. The light absorption layer of the photodetecting element may be smoothly connected to the waveguide layer of the passive waveguide.

The waveguide layer of the passive waveguide may be extended to the position immediately below the light absorption layer of the photodetecting layer.

According to another aspect of the invention, a fabrication process of a waveguide type semiconductor photodetecting device comprises the steps of:

forming a pair of dielectric masks on a compound semiconductor substrate, which dielectric masks is narrowing a gap defined therebetween from a light incident side to a photodiode portion in a waveguide portion;

sequentially growing semiconductor layers consisted of a lower clad layer, a core layer and an upper clad layer on the compound substrate by a metal organic chemical vapor deposition method with taking the dielectric masks as a growth masks; and removing the dielectric masks and burying the semiconductor layers with a burying semiconductor layer.

Preferably, each of the dielectric masks has a constant width in the waveguide portion or gradually increasing toward the photodiode.

A mask width in the photodiode portion of the dielectric mask may be greater than that in the waveguide portion, and a core layer formed between the dielectric masks of the photodiode portion forms a light absorption layer.

The core may be selected from a group consisting of a single layer of InGaAsP, a single layer of InAlGaAs, a multiple quantum well structure of a well layer of InGaAs and a barrier layer of InGaAsP, a multiple quantum well structure of a well layer of InGaAs and a barrier layer of InAlGaAs, a multiple quantum well structure of a well layer of InGaAsP and a barrier layer of InGaAsP, and a multiple quantum well structure of a well layer of InAlGaAs and a barrier layer of InAlGaAs.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiments with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1A:
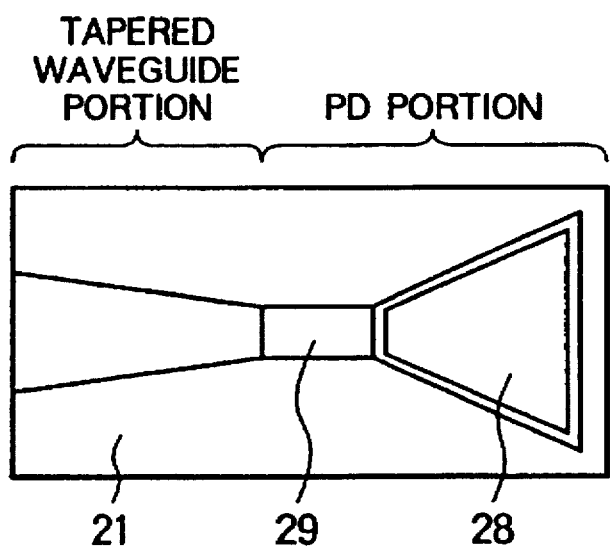
FIGS. 1A and 1B are plan view and a section of the conventional fabrication process of the waveguide type semiconductor photodetecting device.
Figure 1B:
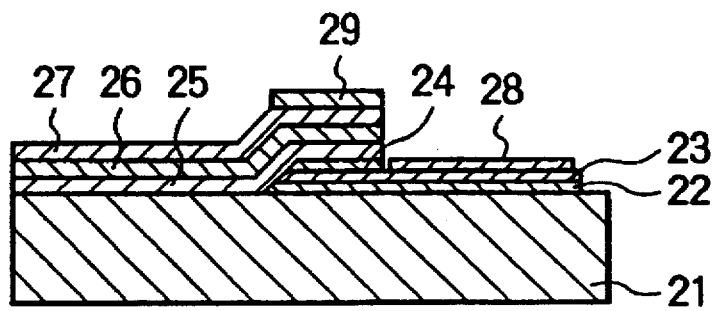
Figure 2A:
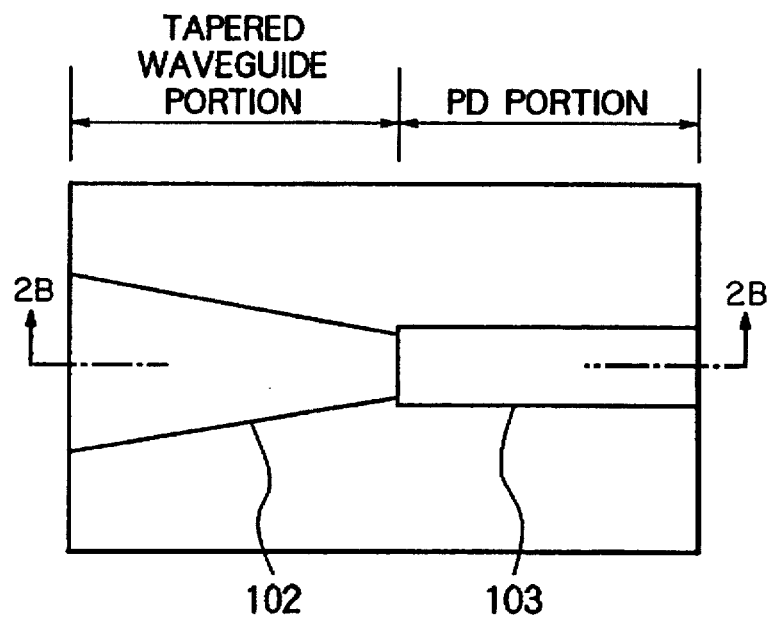
FIGS. 2A and 2B are respectively a plan view and a sectional view for explaining the preferred embodiment of a waveguide type semiconductor photodetecting device according to the present invention.
Figure 2B:
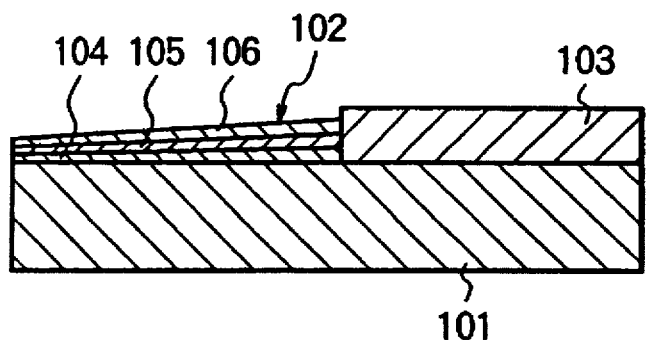

FIG. 2A is a plan view for explaining the preferred embodiment of the present invention and FIG. 2B is a section taken along line A—A of FIG. 2A. In a photodetecting device according to the present invention, a tapered waveguide 102 having width sequentially and gradually narrowed from a light incident side to a PD (photodetecting) portion, and a photodetecting element 103 optically coupled with the tapered waveguide 102 are integrated on a semiconductor substrate 101, as shown in FIGS. 2A and 2B.

As shown in FIG. 2B, the tapered waveguide 102 is constructed with a first clad layer 104, a core layer 105 and a second clad layer 106. The photodetecting device according to the present invention features in that the width of the tapered waveguide 102 is sequentially and gradually narrowed toward the photodetecting element 103, and the thickness of the tapered waveguide 102 is sequentially and gradually increased toward the photodetecting element 103, and in that a refraction index of the core layer 105 is sequentially increased toward the photodetecting element 103.

In the tapered waveguide constructed as set forth above, even a higher-order mode incident light may be propagated to the PD portion without causing external radiation to permit setting of wider width at the light incident side to ease up the coupling tolerance.

By extending the core layer 105 to the PD portion, and setting a band gap wavelength in the PD portion to be longer than or equal to a wavelength of a signal light, the extended portion of the core layer 105 may serve as a light absorption layer in the photodetecting element 103. In the alternative, by setting the band gap wavelength of the extended portion of the core layer 105 within the PD portion to be shorter than the wavelength of the signal light, a waveguide may be formed within the photodetecting element. In such case, the light absorption layer may be formed in a layer other than the core layer 105.

The core layer 105 (including the light absorption layer when the light absorption layer is sequentially formed in the extended portion thereof) may be a single semiconductor layer or a multiple quantum well (MQW). As a semiconductor layer to form the core layer, any one of (1) a single layer of InGaAsP, (2) a single layer of InAlGaAs, (3) a multiple quantum well structure of a well layer of InGaAs and a barrier layer of InGaAsP, (4) a multiple quantum well structure of a well layer of InGaAs and a barrier layer of InAlGaAs, (5) a multiple quantum well structure of a well layer of InGaAsP and a barrier layer of InGaAsP, and (6) a multiple quantum well structure of a well layer of InAlGaAs and a barrier layer of InAlGaAs, can be employed.

Figure 3A:
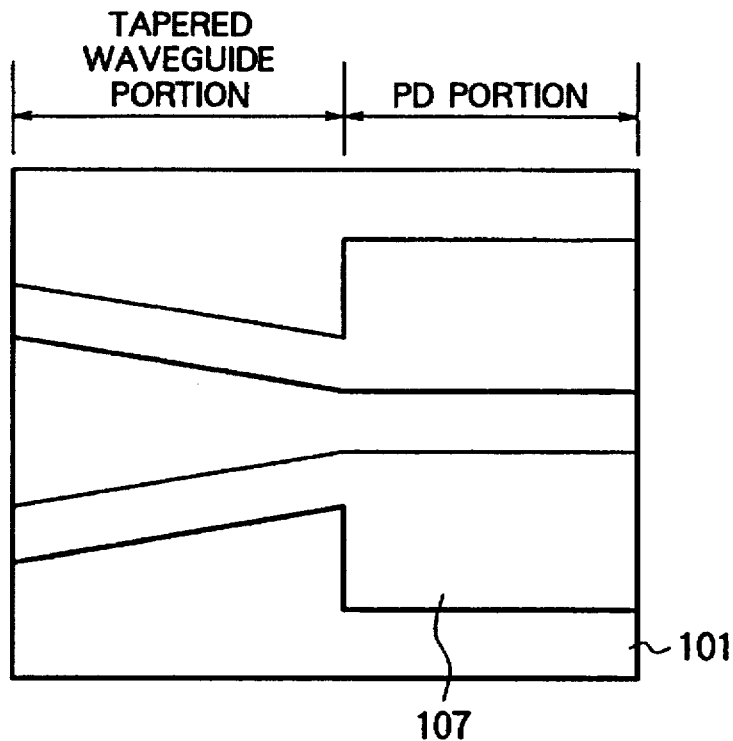
FIGS. 3A and 3B are plane views showing dielectric mask pattern for the explaining the preferred embodiment of a waveguide type semiconductor photodetecting device according to the present invention.
Figure 3B:
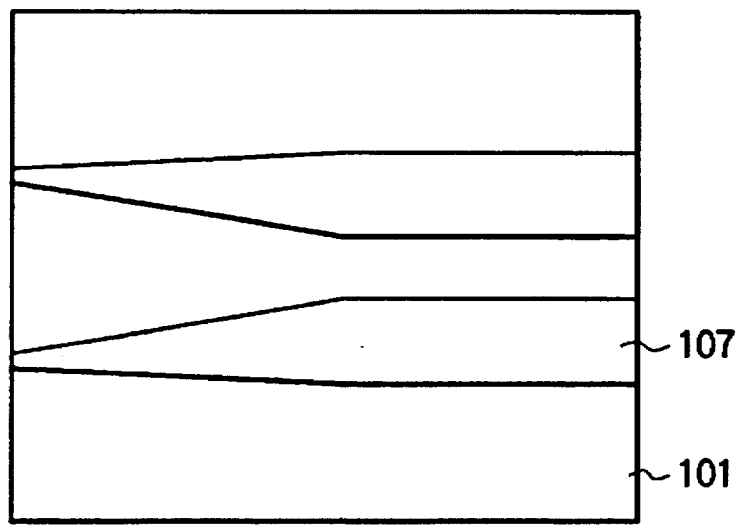

The photodetecting device having the construction illustrated in FIGS. 2A and 2B may be formed by forming a dielectric mask 107 on the semiconductor substrate 101, and depositing semiconductor layers forming the waveguide by way of metal organic chemical vapor deposition (MOCVD) method, as shown in FIGS. 3A and 3B. As shown in FIG. 3A, when a width of a gap between the dielectric masks 107 is narrowed gradually and sequentially in the tapered waveguide portion toward the PD portion side, the layer thickness of the semiconductor layer to be grown is gradually and sequentially increased toward the PD portion side according to narrowing of the width. For example, when InGaAsP is grown as the core layer, composition of the semiconductor layer is then varied according to narrowing of the gap between the dielectric masks 107 in such a manner that the band gap wavelength is shifted toward longer wavelength side and the refraction index becomes greater.

On the other hand, as shown in FIG. 3A, when a mask width in the PD Portion is set to be sufficiently greater than that in the tapered waveguide portion, the band gap wavelength of the core layer 105 growing in the PD portion can be longer than or equal to the wavelength of the signaling light. Then, the extended portion of the core layer 105 located within the PD portion can serve as the light absorption layer.

Further discussion will be given hereinafter in terms of examples of the present invention.

[First Embodiment]

At first, as shown in sectional views of FIGS. 4, 5A, 5B and 5C, on a semi-insulation-type InP substrate 1 having a (001) plane, an $n^+$-InP low resistance layer ($1 \times 10^{18}$ cm$^{-3}$) 2 is grown in a thickness of 1 μm. Next, a SiO$_2$ layer 3 is formed thereon by way of thermal CVD method. Subsequently, by patterning the SiO$_2$ layer through photolithographic process and etching process to form a growth mask of the pattern illustrated in FIG. 4.

The pattern thus formed is a pair of SiO$_3$ layers symmetric to each other with respect to a center axis. A region defined between these mask patterns is the region to form the waveguide. The width of the waveguide is 5 μm in a PD portion 4. The width of the waveguide is widened from the PD portion side (a portion of A2—A2 in FIG. 4) to the light incident end side (a portion of A1—A1 in FIG. 4) sequentially and gradually to be 15 μm at the light incident portion. The width of the mask is 50 μm in the PD portion 4 and 20 μm in the tapered waveguide portion 5. Orientation of the waveguide is [110]. Next, by way of metal organic chemical vapor growth method, with taking the SiO$_2$ layers 3 as the masks for selective growth, an $n^+$-InP buffer layer (clad layer) ($1 \times 10^{18}$ cm$^{-3}$) 6, an $n^-$-InGaAsP layer ($1 \times 10^{16}$ cm$^{-3}$) 7 and an $n^-$-InP clad layer ($1 \times 10^{18}$ cm$^{-3}$) are formed. Layer thicknesses of crystal layer in the PD portion 4 are respectively 0.1 μm, 0.5 μm and 0.2 μm. In this time, the composition and the layer thickness of the $n^-$-InGaAsP layer 7 in the PD portion 4 is different from that in the tapered waveguide portion 5. Furthermore, in the tapered waveguide portion 5, the composition and layer thickness are sequentially and gradually varied from the PD portion 4 to the light incident side.

Figure 4:
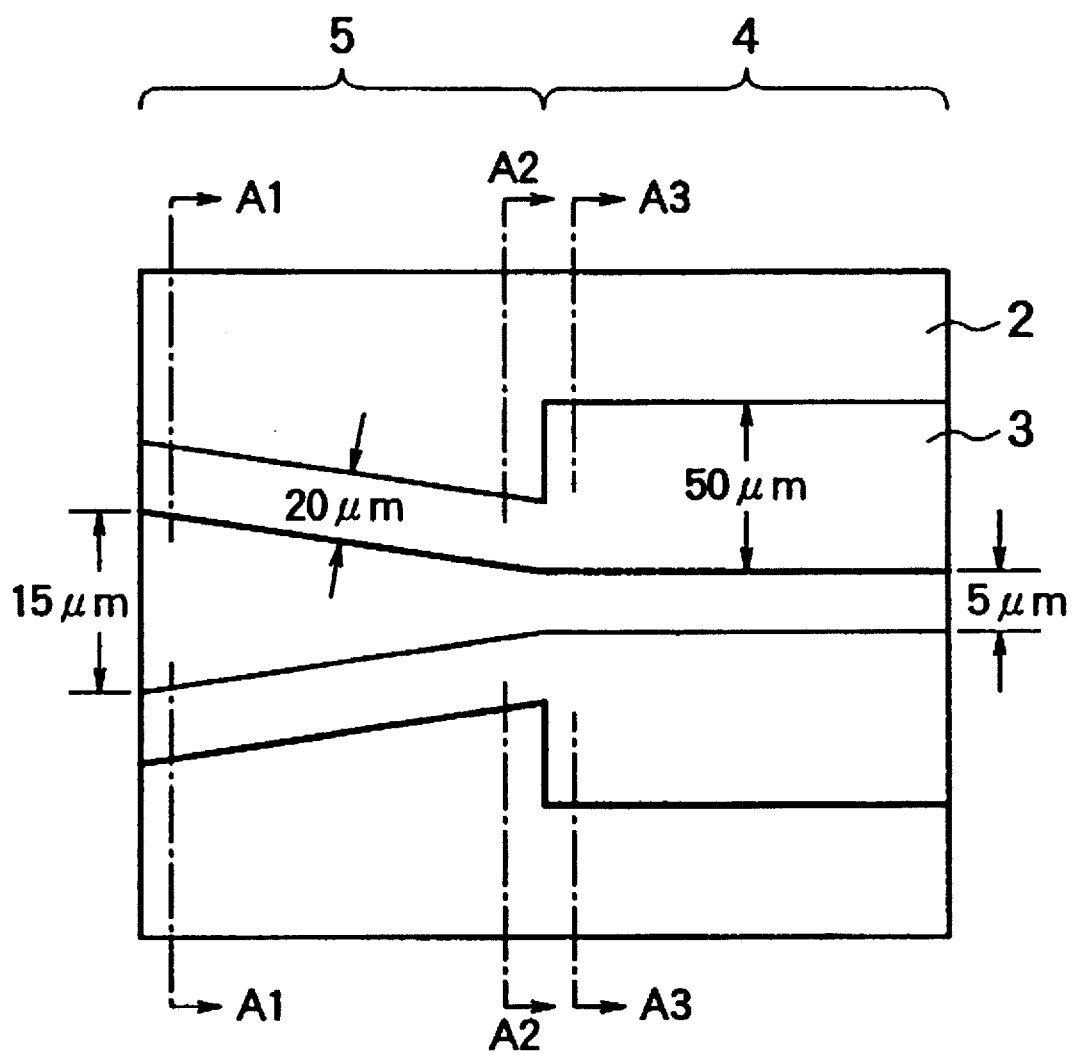
FIG. 4 is a plan view showing a mask pattern for explaining the first embodiment of a waveguide type semiconductor photodetecting device fabrication process according to the present invention.
Figure 5A:
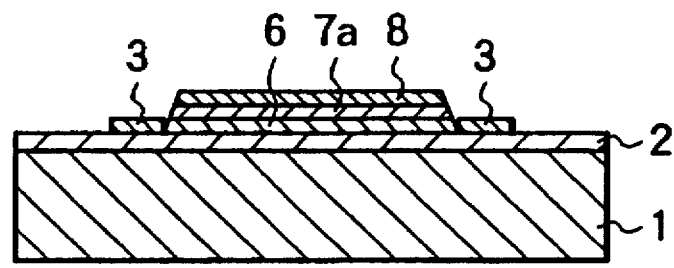
FIGS. 5A, 5B and 5C are cross sections showing intermediate process steps in implementation of the first embodiment of the fabrication process according to the invention.
Figure 5B:
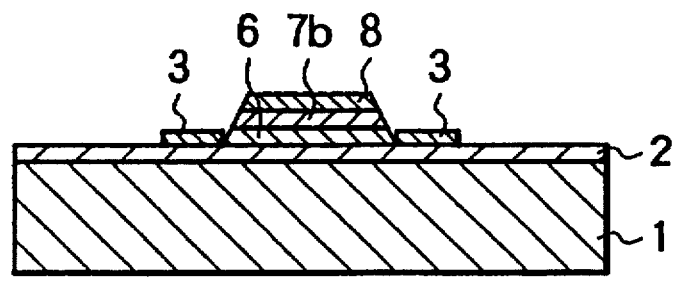
Figure 5C:
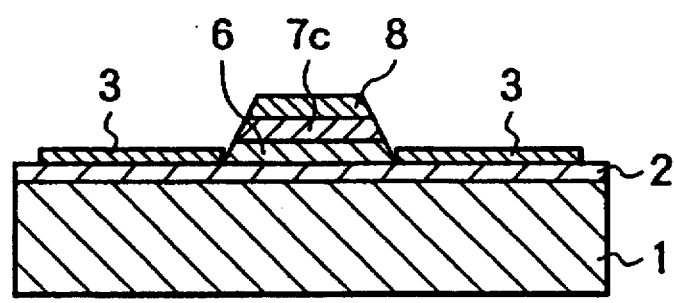
Figure 6A:
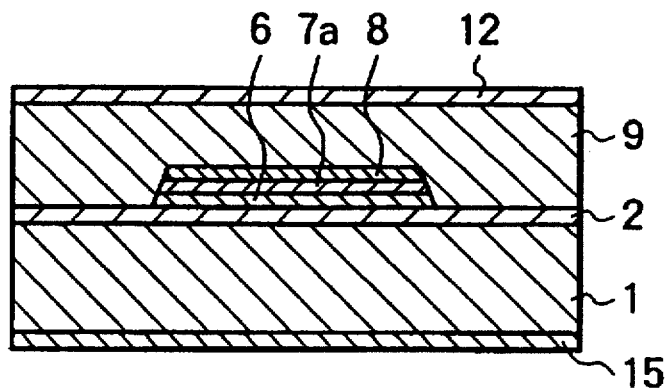
FIGS. 6A, 6B and 6C are cross sections showing intermediate process steps in implementation of the first embodiment of the fabrication process according to the invention.
Figure 6B:
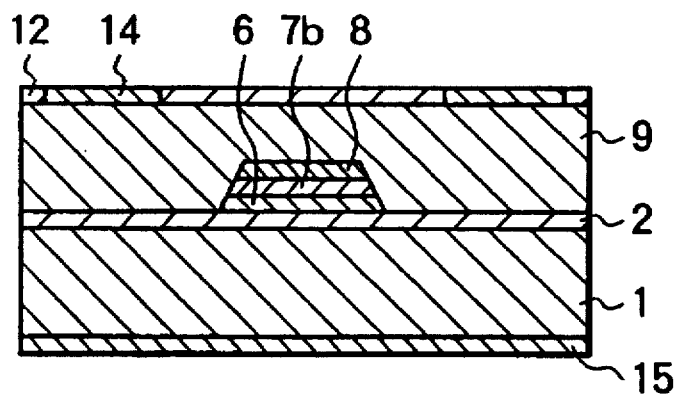

FIGS. 5A, 5B and 5C are sections respectively along lines A1—A1, A2—A2 and A3—A3 in FIG. 4. The $n^-$-InGaAsP layer 7 serves as $n^-$-InGaAsP light absorption layer 7c (having band gap wavelength λg=1.55 μm) having sufficient absorption coefficient with respect to incident light of 1.55 μm band to be used as normal optical communication, in FIG. 5C. In FIGS. 5A and 5B, with respect to the incident light, the $n^-$-InGaAsP layer 7 serves as $n^-$-InGaAsP core layer 7a (band gap wavelength λg=1.15 μm) and 7b (band gap wavelength λg=1.45 μm) with sufficient low loss. Here, difference of compositions and layer thicknesses of the $n^-$-InGaAsP core layers 7a and 7b and the light absorption layer 7c are caused and only depend on mask width and waveguide width of the SiO$_2$ layers 3. These are formed simultaneously and jointly in one crystal growth. In the next step, as shown in FIGS. 6A, 6B and 6C (corresponding to FIGS. 5A, 5B and 5C) after removing the SiO$_2$ layer 3, an $n^-$-InP buried layer ($1 \times 10^{16}$ cm$^{-3}$) in a form burying the selectively grown layer is grown in a layer thickness of 1 μm.

Figure 6C:
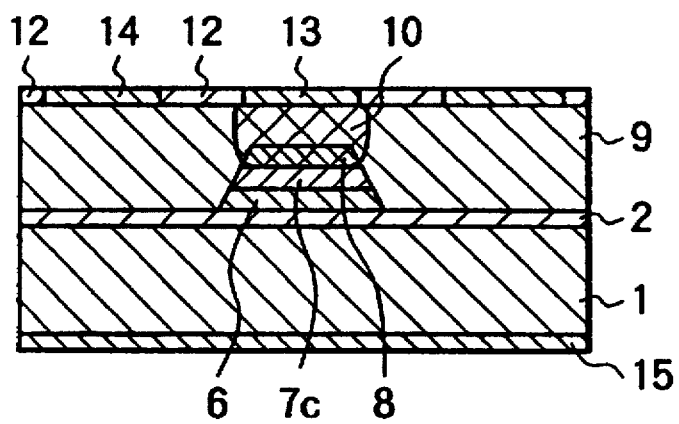
Figure 7A:
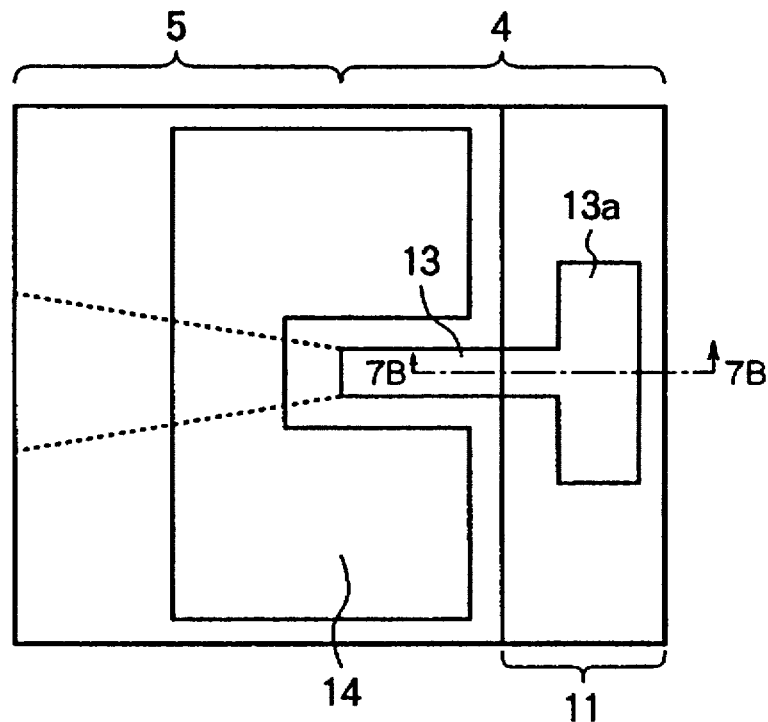
FIGS. 7A and 7B are respectively plan view and sectional view for explaining the first embodiment of the fabrication process of the waveguide type semiconductor photodetecting device according to the invention.
Figure 7B:
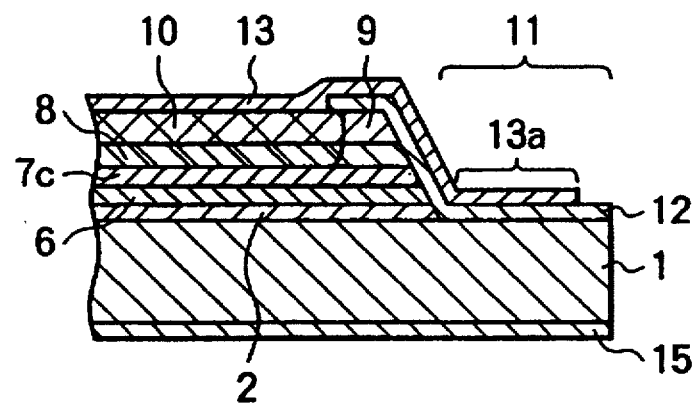

Subsequently, as shown in FIG. 6C, by selective thermal diffusion of Zn, p-type high concentration region 10 is formed only above the PD portion 4. Next, as shown in FIGS. 7A and 7B (FIG. 7B is a section taken along line B—B of FIG. 7A), an epitaxial growth layer in a pad forming region 11 is removed by etching to expose the surface of the semi-insulative InP substrate 1. Thereafter, as shown in FIGS. 6A to 6C and 7A to 7B, a SiN layer 12 as an insulation layer is formed, and an electrode window is thereafter formed. On the p-type high concentration region 10, a TiAu layer 13 as p side electrode to contact with the p-type high concentration region 10 is formed and on the $n^-$-InP buried layer 9, a AuGeNi/TiAu layer 14 as n side electrode is formed to contact with the $n^-$-InP buried layer 9. Subsequently, alloying heat treatment is performed.

At this time, the pad electrode portion 13a of the p side electrode is formed on the pad forming region 11. On the other hand, as shown in FIGS. 7A and 7B, the AuGeNi/TiAu layer 14 is formed at both sides of the TiAu layer 13, and these layers 13 and 14 are connected on the tapered waveguide. Finally, on the back side of the substrate, TiAu layer 15 is formed for preparation to fix the element by AuSn soldering or so forth.

Next, effect of the first embodiment of the present invention will be described. As set forth above, the band gap wavelength λg of the $n^-$-InGaAsP layer 7 is differentiated at respective portions in the element. The band gap wavelength λg of the $n^-$-InGaAsP layer 7 in the PD portion is 1.55 μm and serves as the light absorption layer having sufficient absorption coefficient with respect to the incident light having wavelength of 1.55 μm. On the other hand, the band gap wavelength λg of the $n^-$-InGaAsP layer 7 in the tapered waveguide portion is in a range of 1.45 to 1.15 μm. This tapered waveguide serves as a spot size converter of sufficiently low loss. Furthermore, since this $n^-$-InGaAsP layer 7 are continuously formed in one crystal growth process, no re-grown interface is present between a boundary portion between the PD portion and the tapered waveguide portion. Therefore, quite high coupling efficiency can be obtained.

Discussion of other effect of the first embodiment will be given with reference to FIGS. 8A to 8D and 9A to 9D. FIG.

8A diagrammatically shows the n⁻-InGaAsP layer 7 in the tapered waveguide portion and the PD portion of the shown embodiment of the photodetecting device. FIGS. 8B, 8C and 8D show models of refraction index distribution with respect to the light of 1.55 μm, in which FIG. 8B shows a section of the waveguide in the PD portion ((B) in FIG. 8A), FIG. 8C shows a section of the waveguide in the PD side end of the tapered waveguide ((C) in FIG. 8A), and FIG. 8D shows a section of the waveguide in the light incident end of the tapered waveguide ((D) in FIG. 8A). Refraction index and the layer thickness of the InGaAsP core layer is differentiated at respective portions.

Figure 8A:
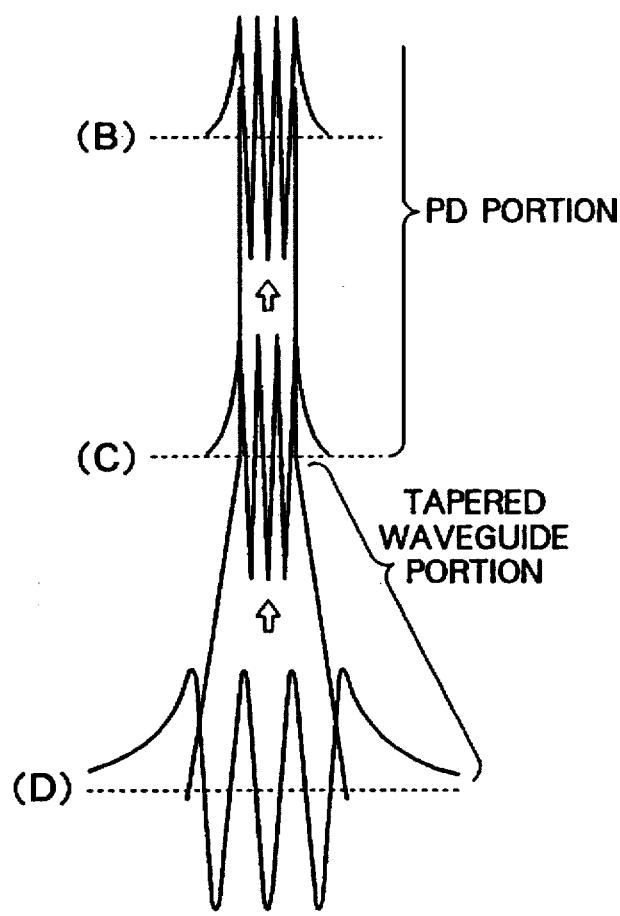
FIGS. 8A, 8B, 8C and 8d are diagrammatic illustration showing light propagating condition for explaining effect of the first embodiment of the fabrication process according to the invention.
Figure 8B:
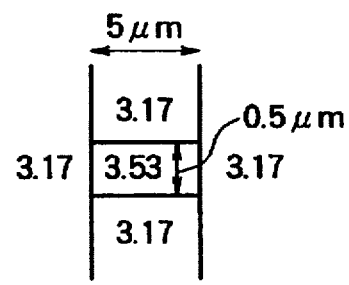
Figure 8C:
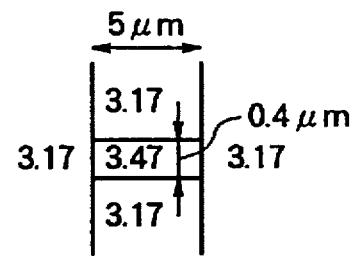
Figure 8D:
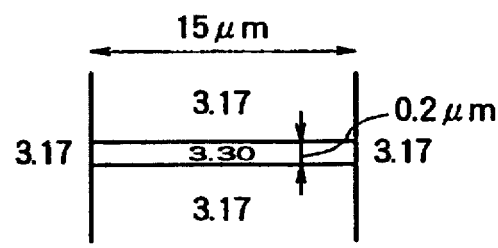
Figure 9A:
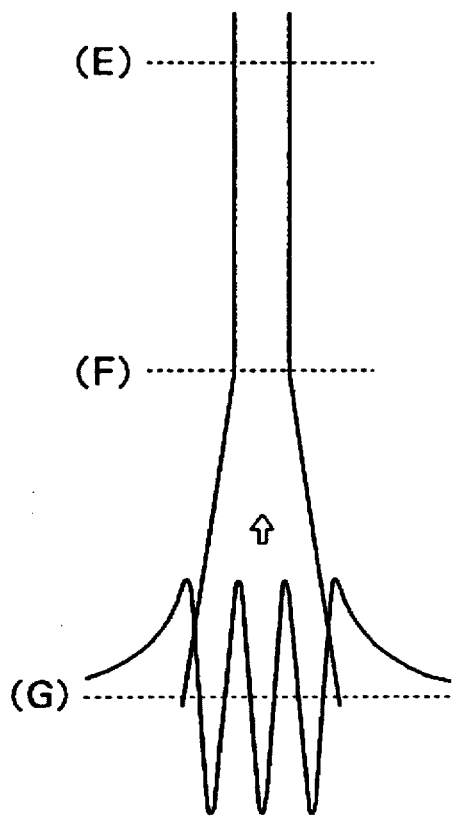
FIGS. 9A, 9B, 9C and 9D are similar illustration to FIGS. 8A, 8B, 8C and 8D but showing drawback in the prior art.
Figure 9B:
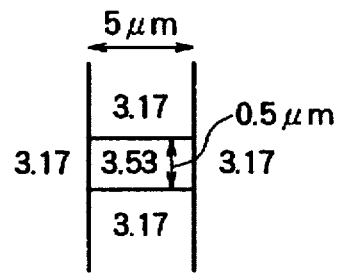
Figure 9C:
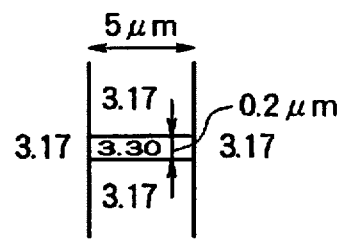
Figure 9D:
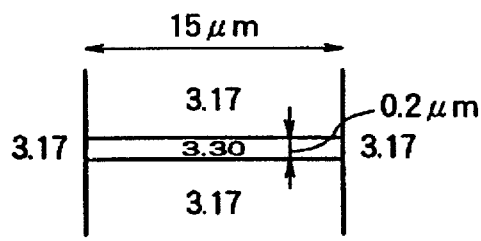

Curves shown at (B), (C) and (D) of FIG. 8A are electric field distribution of sixth mode light of horizontal transverse mode calculated utilizing refraction index distribution modes of FIGS. 8B, 8C and 8D. FIGS. 9A to 9D are example, in which the tapered waveguide portion and the PD portion are integrated through several times of crystal growth, contrary to the present invention. FIGS. 9A, 9B, 9C and 9D are respectively corresponded to FIGS. 8A, 8B, 8C and 8D. On the other hand, (E), (F) and (G) in FIG. 9A respectively correspond to (A), (B) and (C) of FIG. 8A.

The waveguide modes in the light incident end of the tapered waveguide portion is present from zero-order to sixth modes as horizontal transverse mode. In the example of FIGS. 9A to 9D, the layer thickness and the refraction index of the InGaAsP core layer in the tapered waveguide are constant. As a result, at the PD side end of the tapered waveguide portion (at the position of (F) of FIG. 9A), since the width of the waveguide is narrowed, higher-order mode light is cut-off to cause large radiation loss. In practice, the refraction index distribution model of FIG. 9C, only up to secondary mode as horizontal transverse mode is present. Third to sixth mode lights excited at the light incident end of the tapered waveguide are radiated at the mid-way in propagation through the tapered waveguide to cause lowering of sensitivity.

In contrast to this, since the shown embodiment of FIGS. 8A to 8D has layer thickness and refraction index gradually and sequentially increasing from the light incident end of the tapered waveguide to the PD portion side, the higher-order mode light is not cut-off even when the waveguide is narrowed. In practice, in case of the embodiment of FIGS. 8A to 8D, even the sixth mode light which is the highest order mode excited at the light incident side, shown in FIG. 8A, can be guided to the PD portion without being cut-off. Accordingly, the photodetecting device which has no radiation loss due to cut-off, can be realized with quite high sensitivity and high coupling tolerance.

It should be noted that while an example, in which the band Gap wavelength g of the n⁻-InGaAsP layer 7 is 1.55 μm in the PD portion 4 in the first embodiment, the same effect can be obtained even in the longer wavelength than 1.55 μm. On the other hand, as the light absorption layer of the core layer of the tapered waveguide portion 5 and the PD portion 4, similar effect can be obtained even in the case where n⁻InAlGaAs layer is employed in place of the n⁻-InGaAsP layer.

Next, discussion will be given for an effect by employing the n⁺-InP low resistance layer 2 and AuGeNi/TiAu layer 14 in the first embodiment. As shown in FIG. 6C, the n side electrode of the shown embodiment has a structure flared in the horizontal direction on the semi-insulative substrate. In general, a parasitic resistance value in the transverse electrode is determined by a sheet resistance of the semiconductor layer, contact resistivity between the semiconductor layer and the electrode, and an electrode width in a direction perpendicular to a direction of the electric current. The n⁺-InP low resistance layer 2 has an effect for lowering the sheet resistance. Since the sheet resistance is inversely proportional to concentration of the semiconductor layer, in case of the shown embodiment, the sheet resistance can be lowered to be about one hundredth in comparison with the case where n⁺-InP low resistance layer 2 is not employed. On the other hand, as shown in FIG. 7, the AuGeNi/TiAu layers 14 are formed at both sides of the TiAu layer 13. Furthermore, since these layers 13 and 14 are connected, parasitic resistance can be reduced to be half. By these effect, the shown embodiment can realize an element having quite low parasitic resistance and superior high speed response characteristics.

[Second Embodiment]

Figure 10:
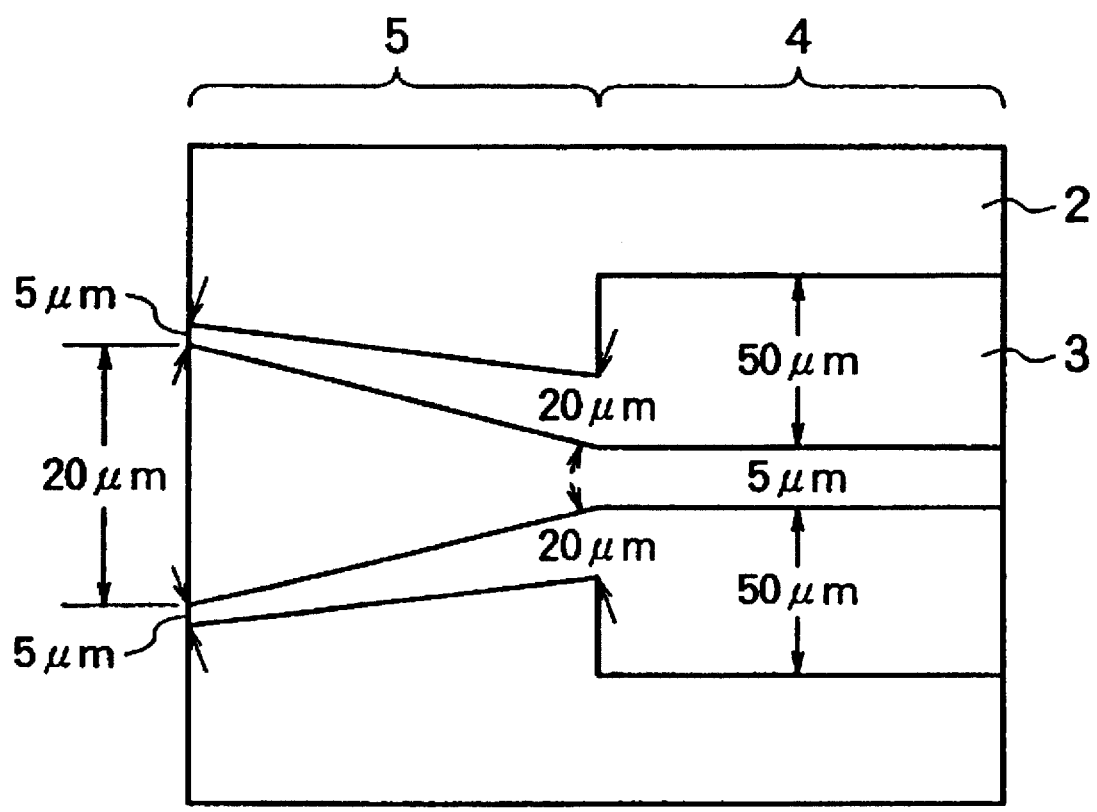
FIG. 10 is a plan view showing a mask pattern for explaining the second embodiment of the waveguide type semiconductor photodetecting device fabrication process according to the invention.

Next, discussion will be given for the second embodiment of the present invention with reference to FIG. 10. FIG. 10 shows a mask pattern for selective growing formed with the SiO₂ layer 3 corresponding to FIG. 4 in the first embodiment. The mask pattern shown in FIG. 10 is differentiated from the pattern shown in FIG. 4 in that the width of the tapered waveguide at the light incident end is 20 μm which is wider than that in FIG. 4. On the other hand, the mask width in the tapered waveguide portion is narrower to be 5 μm which is narrower than the mask width of FIG. 4. Except for the point, in which the selective growing mask pattern, other element fabrication processes and so forth are similar to those in the case of the first embodiment.

In this embodiment, as shown in FIG. 10, the width of the selective growing mask is gradually and sequentially narrowed from the PD portion side to the light incident side in the tapered waveguide portion. Narrowing of the mask width, the layer thickness of the n⁻-InGaAsP layer 7 to be selectively grown becomes thinner, and the refraction index is lowered. Accordingly, even when the waveguide width at the light incident end side is widened more, the higher-order waveguide mode can not be accepted. With maintaining the effect discussed with respect to FIG. 8, high coupling tolerance can be obtained associating with widened waveguide width at the light incident end.

[Third Embodiment]

Next, discussion will be given with respect to the third embodiment of the invention. While it is not particularly illustrated, in the present embodiment, in place of the n⁻-InGaAsP core layer 7a and 7b and the light absorption layer 7c in FIGS. 5A to 5C, the multiple quantum well (MQW) layer consisted of n⁻-InGaAsP well layer and n⁻-InGaAsP barrier layer is employed. Except for this point, other element fabrication processes are similar to those in the second embodiment.

In the shown embodiment, in place of the n⁻-InGaAsP layer 7 in the first embodiment, the MQW layer is employed. So, a large variation of the band gap wavelength λg can be obtained. This is because that in addition to variation of composition, variation of the layer thickness of the well layer contributes for variation of the wavelength λg in the MQW layer. Accordingly, in the PD portion, the wavelength λg becomes greater than the former embodiment to achieve higher sensitivity in the PD portion, and the wavelength λg becomes shorter to achieve lower loss in the tapered waveguide portion to realize the element with higher performance.

On the other hand, while the shown embodiment as illustrated employs the multiple quantum well (MQW) layer consisted of the n⁻-InGaAsP well layer and the n⁻-InGaAsP barrier layer, similar effect should be obtained even in the case where n⁻-InGaAs layer or n⁻InAlGaAs layer is employed as the well layer and n⁻-InP layer, n⁻InAlGaAs layer or n⁻-InAlAs layer is employed as the barrier layer.

[Fourth Embodiment]

Figure 11A:
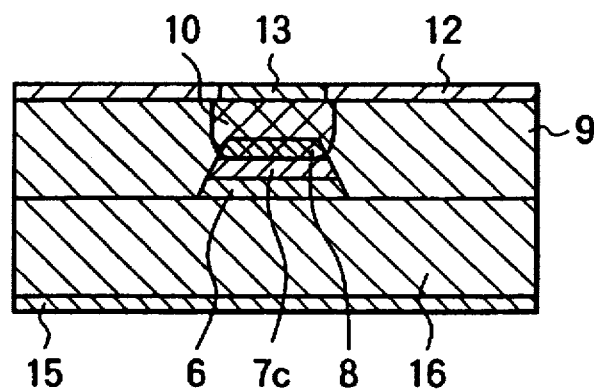
FIGS. 11A and 11B are respectively a cross section and a plan view for explaining the fourth embodiment of the waveguide type semiconductor photodetecting device fabrication process according to the invention.
Figure 11B:
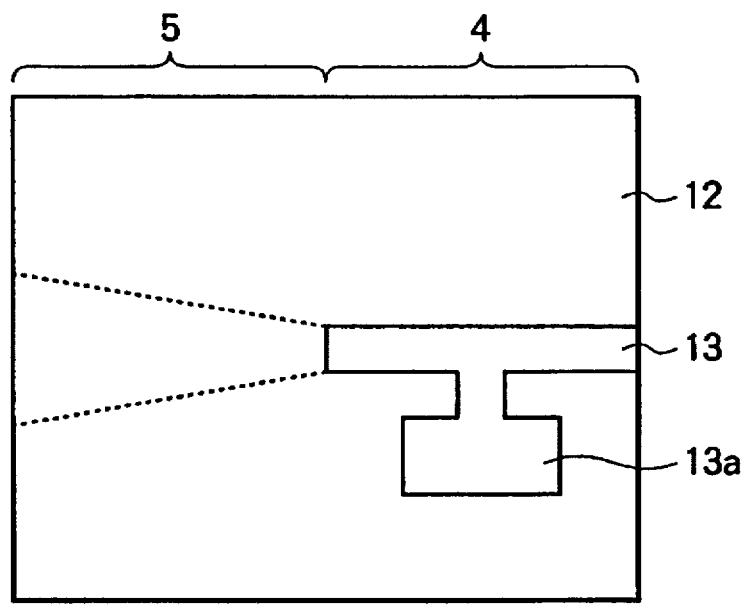

Next, discussion will be given for the fourth embodiment of the present invention with reference to FIGS. 11A and 11B. FIG. 11A is a section at a position corresponding to FIG. 6C of the first embodiment, and FIG. 11B shows a portion corresponding to the portion and process shown in FIG. 7A. As shown in FIGS. 11A and 11B, n⁺-InP substrate 16 is employed as the substrate, and the n⁺-InP low resistance layer 2 is not formed. TiAu layer 15 is employed as the n side electrode, and AuGeNi/TiAu layer 14 is not formed. On the other hand, without forming the pad forming region 11 as illustrated in FIG. 7, the pad electrode portion 13a of the p side electrode is formed on the n⁻-InP buried layer 9 through SiN layer 12. Other element fabrication processes are similar to those in the first, second and third embodiments set forth above.

With the fourth embodiment, the photodetecting device can be fabricated at lesser process steps and lower cost in comparison with the first, second and third embodiments.

[Fifth Embodiment]

Figure 12:
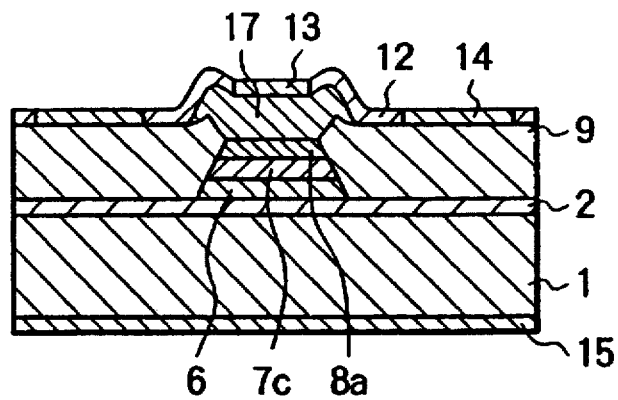
FIG. 12 is a section showing the fifth embodiment of the waveguide type semiconductor photodetecting device according to the invention.

Next, discussion will be given for the fifth embodiment of the present invention with reference to FIG. 12. FIG. 12 is a section at the position corresponding to the position of FIG. 6C in the first embodiment. In the shown embodiment, in place of the n⁻-InP clad layer 8, a p⁺-InP clad layer ($1 \times 10^{18}$ cm⁻³) 8a is formed. On the other hand, upon forming the n⁻-InP buried layer 9, after burying only side wall portion of mesa structure consisted of the n⁺-InP buffer layer 6, the n⁻-InGaAsP layer 7 and a p⁺-InP clad layer 8a, a p⁺-InP layer 17 is grown above the p⁺-InP clad layer 8a. Other fabrication processes are similar to the first, second or third embodiment.

In the shown embodiment, there is no process step forming the p-type high concentration region 10 through selective thermal diffusion to cause lowering of yield due to difficulty in control of the diffusion depth.

[Sixth Embodiment]

Figure 13A:
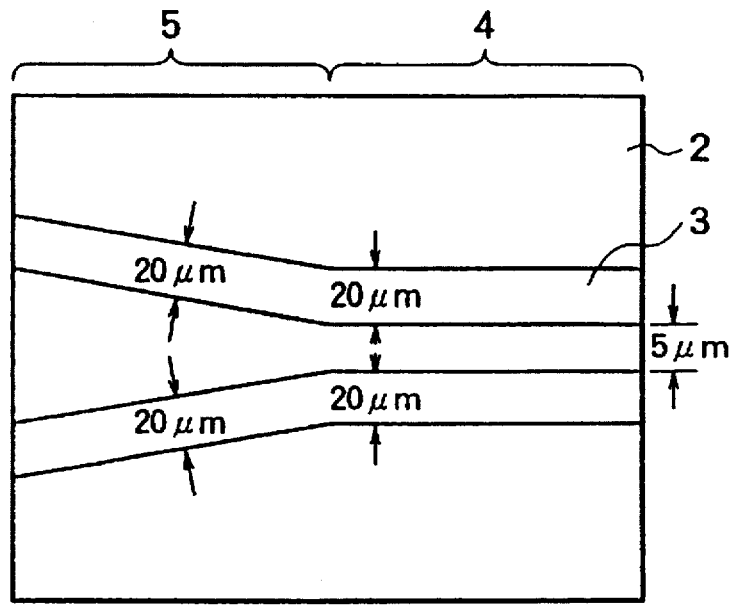
FIGS. 13A and 13B are respectively a plan view (showing a mask pattern) and a sectional view for explaining the sixth embodiment of the waveguide type semiconductor photodetecting device fabrication process according to the invention.
Figure 13B:
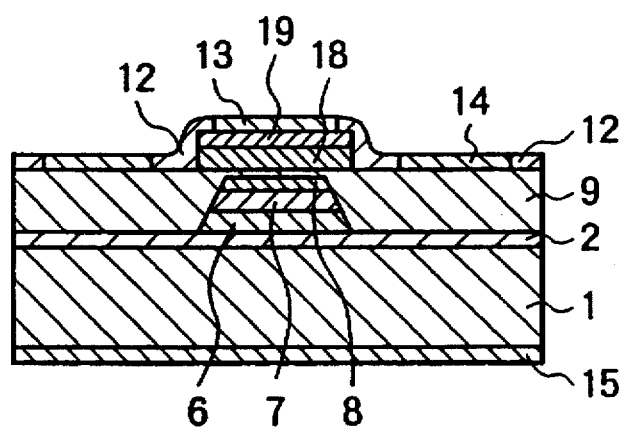

Next, the sixth embodiment of the present invention will be discussed with reference to FIGS. 13A and 13B. FIG. 13A corresponds to the first embodiment as illustrated in FIG. 4, and FIG. 13B is a section at a position corresponding to the section of the first embodiment of FIG. 6C. As shown in FIG. 13A, the width of the selective growing mask in the shown embodiment is 20 μm even in the PD portion 4. Then, the band gap wavelength of the n⁻-InGaAsP layer 7 is 1.45 μm.

On the other hand, as shown in FIG. 13B, the n⁻-InGaAs light absorption layer ($1 \times 10^{18}$ cm⁻³) 18 in a thickness of 0.5 μm, and p⁺-InP clad layer ($1 \times 10^{18}$ cm⁻³) 19 in a thickness of 0.5 μm are formed above the n⁻-InP buried layer 9. Thereafter, with remaining the upper region of the n⁻-InGaAsP layer 7 of the PD layer 4, the n⁻-InGaAs light absorption layer 18 and the p⁺-InP clad layer 19 are removed. Other element fabrication processes and so forth are similar to the first, second or third embodiment.

The sixth embodiment is an evanescent wave coupling type element, in which exuding of light guided through the n⁻-InGaAsP layer 7 of the PD portion 4 is absorbed by the n⁻-InGaAs light absorption layer 18. In this embodiment, since process step forming the p-type high concentration region 10 through selective thermal diffusion is not included, yield is not lowered due to difficulty in controlling of the diffusion depth. Different from the fifth embodiment, the tapered waveguide 5 is formed with only n-type semiconductor layer having small absorption loss in comparison with p-type. Therefore, element characteristics with low loss and high sensitivity can be obtained.

As set forth above, the photodetecting device according to the present invention is formed with the tapered waveguide to be optically coupled with the photodetecting element, which gradually narrows the width toward the photodetecting element and gradually increasing the layer thickness and refraction index toward the photodetecting element, the higher-order mode light inciding in the waveguide can be propagated to the photodetecting element via the tapered waveguide. Accordingly, with the present invention, the incident side of the tapered waveguide is widened and the coupling tolerance with the optical fiber is enhanced to realize high speed operation for achieving higher package density.

On the other hand, according to the fabrication process according to the present invention, the core layer of the waveguide, the core layer of the PD portion and the light absorption layer can be formed in one selective growth. Thus, process step can be reduced and higher reliability of the product can be achieved. Furthermore, the core layer of the waveguide portion is formed sequentially with the light absorption layer in the PD portion to achieve high light coupling efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A waveguide type semiconductor photodetecting device comprising:
    a semiconductor substrate;
    a photodetecting element;
    a passive waveguide optically coupled with said photodetecting element and having a waveguide layer gradually narrowing a width and gradually increasing a layer thickness and a refraction index from light incident side to said photodetecting element, which passive waveguide is integrated with said photodetecting element on said semiconductor substrate.

2. A waveguide type semiconductor photodetecting device as set forth in claim 1, wherein said waveguide layer of said passive waveguide and/or a light absorption layer of said photodetecting element have a multiple quantum well structure.

3. A waveguide type semiconductor photodetecting device as set forth in claim 2, wherein said light absorption layer of said photodetecting element is smoothly connected to said waveguide layer of said passive waveguide.

4. A waveguide type semiconductor photodetecting device as set forth in claim 1, wherein said waveguide layer of said passive waveguide is extended to the position immediately below said light absorption layer of said photodetecting layer.

* * * * *